US012666823B2

(12) United States Patent　　　(10) Patent No.:　US 12,666,823 B2
Kim et al.　　　　　　　　　　　　(45) Date of Patent:　Jun. 23, 2026

(54) DISPLAY APPARATUS

(71) Applicant: Samsung Display Co., Ltd., Yongin-si (KR)

(72) Inventors: Jaewon Kim, Yongin-si (KR); Junyoung Min, Yongin-si (KR); Junwon Choi, Yongin-si (KR); Okkyung Park, Yongin-si (KR); Changsoo Pyon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 619 days.

(21) Appl. No.: 18/153,885

(22) Filed: Jan. 12, 2023

(65) Prior Publication Data

US 2023/0232683 A1　　Jul. 20, 2023

(30) Foreign Application Priority Data

Jan. 14, 2022　　(KR) ........................ 10-2022-0006179

(51) Int. Cl.
　　H10K 59/131　　　(2023.01)
　　H10K 59/121　　　(2023.01)
(52) U.S. Cl.
　　CPC ....... H10K 59/131 (2023.02); H10K 59/1213 (2023.02); H10K 59/1216 (2023.02)
(58) Field of Classification Search
　　CPC .. H10D 86/481; H10D 86/60; H10K 59/1216; H10K 59/1213; H10K 59/131
　　See application file for complete search history.

(56) References Cited

U.S. PATENT DOCUMENTS

| | | | |
|---|---|---|---|
| 5,929,464 A | 7/1999 | Yamazaki et al. | |
| 8,860,638 B2 | 10/2014 | Kim et al. | |
| 9,000,424 B2 | 4/2015 | Moon | |
| 10,566,402 B2 | 2/2020 | Cho et al. | |
| 10,833,603 B2 * | 11/2020 | Agirman ................ H02P 27/08 | |
| 11,075,226 B2 | 7/2021 | Chen et al. | |
| 2006/0097368 A1 * | 5/2006 | Seko ................... H10W 70/688 | |
| | | | 257/E21.511 |

(Continued)

FOREIGN PATENT DOCUMENTS

| | | |
|---|---|---|
| CN | 001140337 A | 1/1997 |
| KR | 10-0719707 B1 | 3/2007 |

(Continued)

*Primary Examiner* — Shaheda A Abdin
(74) *Attorney, Agent, or Firm* — Womble Bond Dickinson (US) LLP

(57)　　　　　ABSTRACT

A display apparatus includes substrate a semiconductor layer on the substrate, and having a semiconductor pattern, a first conductive layer on the semiconductor layer, and including a first wiring that extends in a first direction, a second wiring that protrudes from the first wiring in a second direction crossing the first direction, and a driving gate electrode, and a second conductive layer on the first conductive layer, and including a first electrode that overlaps the driving gate electrode, wherein the semiconductor pattern includes a first pattern that extends in the first direction and overlaps the second wiring, and a second pattern that extends in the second direction and overlaps the first wiring, and wherein the first electrode includes a protruding electrode that overlaps at least part of the first pattern and at least part of the second pattern.

20 Claims, 10 Drawing Sheets

(56)  References Cited

U.S. PATENT DOCUMENTS

| 2017/0365647 A1 | 12/2017 | Choi et al. |
| 2020/0135831 A1 | 4/2020 | Bae et al. |

FOREIGN PATENT DOCUMENTS

| KR | 10-1073174 B1 | 10/2011 |
| KR | 10-2203385 B1 | 7/2015 |
| KR | 10-2021-0112428 A | 9/2021 |

* cited by examiner

DISPLAY APPARATUS

CROSS-REFERENCE TO RELATED APPLICATION

This application claims priority to, and the benefit of, Korean Patent Application No. 10-2022-0006179, filed on Jan. 14, 2022 in the Korean Intellectual Property Office, the disclosure of which is incorporated by reference herein in its entirety.

BACKGROUND

1. Field

One or more embodiments relate to display apparatuses that reduce or prevent a change in the luminance of a pixel due to an adjacent wiring.

2. Description of the Related Art

Display apparatuses include display devices and electronic devices for controlling an electrical signal applied to display devices. The electronic devices include thin film transistors (TFTs), storage capacitors, and a plurality of wirings.

To accurately control the emission of a display device and a degree of emission, the number of TFTs electrically connected to one display device is increased, and the number of wirings for transmitting electrical signals to the TFTs is also increased.

SUMMARY

However, in display apparatuses according to the related art, to implement a compact or high-resolution display apparatus, intervals between constituent elements of thin film transistors and/or wirings included in display apparatuses decrease, and thus, the luminance and the like of a pixel may vary due to a voltage applied to adjacent wirings.

One or more embodiments include display apparatuses capable of preventing or reducing a change in the luminance of a pixel due to adjacent wirings. However, such an aspect is merely an example, and the scope of the present disclosure is not limited thereby.

Additional aspects will be set forth in part in the description which follows and, in part, will be apparent from the description, or may be learned by practice of the presented embodiments of the disclosure.

According to an aspect of the disclosure, a display apparatus includes a substrate a semiconductor layer on the substrate, and having a semiconductor pattern, a first conductive layer on the semiconductor layer, and including a first wiring that extends in a first direction, a second wiring that protrudes from the first wiring in a second direction crossing the first direction, and a driving gate electrode, and a second conductive layer on the first conductive layer, and including a first electrode that overlaps the driving gate electrode, wherein the semiconductor pattern includes a first pattern that extends in the first direction and overlaps the second wiring, and a second pattern that extends in the second direction and overlaps the first wiring, and wherein the first electrode includes a protruding electrode that overlaps at least part of the first pattern and at least part of the second pattern.

The semiconductor layer may include a first initialization voltage line and a second initialization voltage line that extend in the first direction, wherein the semiconductor pattern is electrically connected to the first initialization voltage line and the second initialization voltage line.

The display apparatus may further include a first compensation transistor having, as a gate electrode, the second wiring that overlaps the first pattern, and a second compensation transistor having, as a gate electrode, the first wiring that overlaps the second pattern, wherein the first pattern and the second pattern are provided as one body.

The display apparatus may further include a compensation capacitor having the protruding electrode as an upper electrode, and having at least part of the first pattern and at least part of the second pattern that overlap the protruding electrode as a lower electrode.

The display apparatus may further include a storage capacitor having the first electrode as an upper electrode, and having the driving gate electrode as a lower electrode, wherein a capacitance of the compensation capacitor is about 50% or more of a capacitance of the storage capacitor.

The semiconductor pattern and the first electrode may respectively include a plurality of semiconductor patterns and a plurality of first electrodes extending in the first direction, wherein the second conductive layer further includes a connection portion that connects adjacent first electrodes.

The first electrode and the connection portion may be provided as one body.

The second conductive layer may further include a first scan line extending in the first direction and electrically connected to the second wiring.

The first conductive layer may include a second lower scan line and a third lower scan line that extend in the first direction, wherein the second conductive layer includes a second scan line electrically connected to the second lower scan line, and a third scan line electrically connected to the third lower scan line, wherein the second lower scan line and the second scan line overlap each other, and wherein the third lower scan line and the third scan line overlap each other.

The display apparatus may further include a third conductive layer on the second conductive layer and including a data line that extends in the second direction, wherein the protruding electrode overlaps part of the data line.

The protruding electrode may protrude from the first electrode in the second direction.

The third conductive layer may further include a driving voltage line that extends in the second direction, wherein the driving voltage line is electrically connected to the first electrode.

The first electrode may expose an exposed part of the driving gate electrode, wherein a first side of the first pattern is connected to the second pattern, and wherein a second side of the first pattern is electrically connected to the exposed part of the driving gate electrode.

The semiconductor pattern may include a plurality of semiconductor patterns extending in the first direction, wherein the display apparatus further includes a fourth conductive layer on the second conductive layer and including a plurality of pixel electrodes, and wherein a first pixel electrode connected to a first semiconductor pattern of the semiconductor patterns includes a first protruding portion that overlaps a first pattern of the first semiconductor pattern.

A second pixel electrode connected to a second semiconductor pattern of the semiconductor patterns may overlap the second semiconductor pattern and a third semiconductor pattern that is adjacent to the second semiconductor pattern, wherein the second pixel electrode includes a second protruding portion that overlaps a first pattern of the second semiconductor pattern, and a third protruding portion that overlaps a first pattern of the third semiconductor pattern.

The first pixel electrode and the second pixel electrode may be alternately arranged in the first direction, wherein a third pixel electrode connected to the third semiconductor pattern is arranged to alternate with the first pixel electrode or the second pixel electrode in the second direction.

The display apparatus may further include a gate insulating layer between the semiconductor layer and the first conductive layer, and an interlayer insulating layer between the first conductive layer and the second conductive layer, wherein the driving gate electrode and the first electrode overlap each other with the interlayer insulating layer therebetween.

The display apparatus may further include a first scan line that is on the interlayer insulating layer and extends in the first direction, wherein the first electrode and the first scan line include a same material.

The protruding electrode, at least part of the first pattern, and at least part of the second pattern, may overlap each other with the gate insulating layer and the interlayer insulating layer respectively therebetween.

The display apparatus may further include a planarization layer on the second conductive layer, and a third conductive layer on the planarization layer and including a driving voltage line and a data line that extend in the second direction, wherein the first electrode and the driving voltage line are connected to each other through a contact hole provided in the planarization layer.

Other aspects than those described above will become apparent from the following drawings, claims, and detailed description of the disclosure.

BRIEF DESCRIPTION OF THE DRAWINGS

The above and other aspects of certain embodiments of the disclosure will be more apparent from the following description, taken in conjunction with the accompanying drawings, in which.

DETAILED DESCRIPTION

Figure 1:
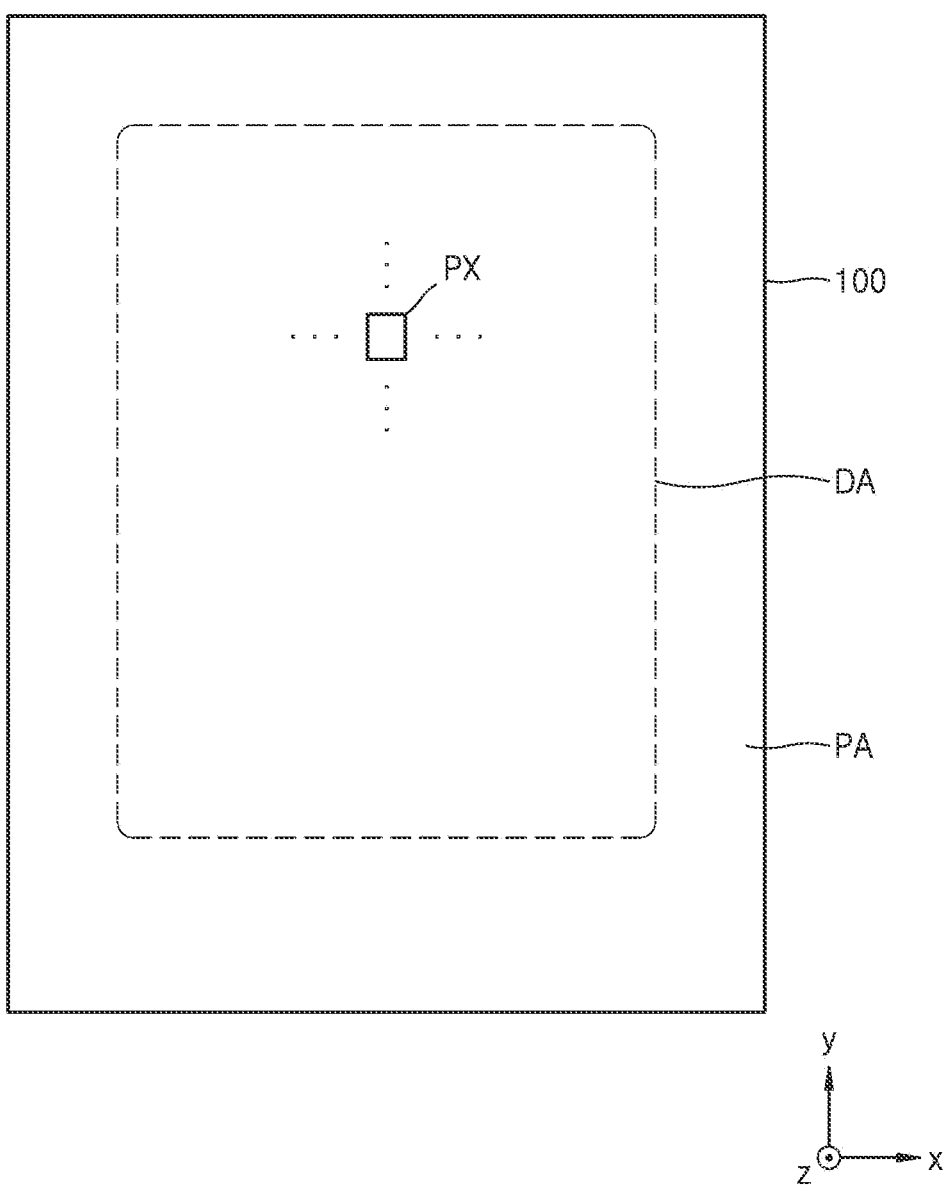
FIG. 1 is a schematic plan view of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s)

as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display apparatus according to one or more embodiments.

Referring to FIG. 1, the display apparatus includes a substrate 100. The substrate 100 has a display area DA, and a peripheral area PA outside the display area DA.

The display area DA of the substrate 100 is a portion for displaying an image, in which a plurality of pixels PX may be located. Each of the pixels PX may mean a sub-pixel, and may include a display device such as an organic light-emitting diode OLED. The pixel PX may emit, for example, red, green, blue, or white light.

When viewed from a direction approximately perpendicular to the substrate 100, the display area DA may have various shapes, for example, a circular shape, an oval shape, a polygonal shape, a specific figure shape, and the like. FIG. 1 illustrates that the display area DA has an approximately rectangular shape with rounded corners. The peripheral area PA may be located outside the display area DA. Various wirings for transmitting electrical signals to be applied to the display area DA may be located in the peripheral area PA of the substrate 100.

In the following description, an organic light-emitting display apparatus is described as an example of a display apparatus according to one or more embodiments of the disclosure, but the disclosure is not limited thereto. In one or more other embodiments, a display apparatus according to one or more embodiments may include an inorganic light-emitting display apparatus, an inorganic EL display apparatus, or a quantum-dot light-emitting display apparatus. For example, an emission layer of a display device included in a display apparatus may include an organic material or an inorganic material. Furthermore, a display apparatus may include an emission layer, and a quantum dot located on a path of light emitted from the emission layer.

Figure 2:
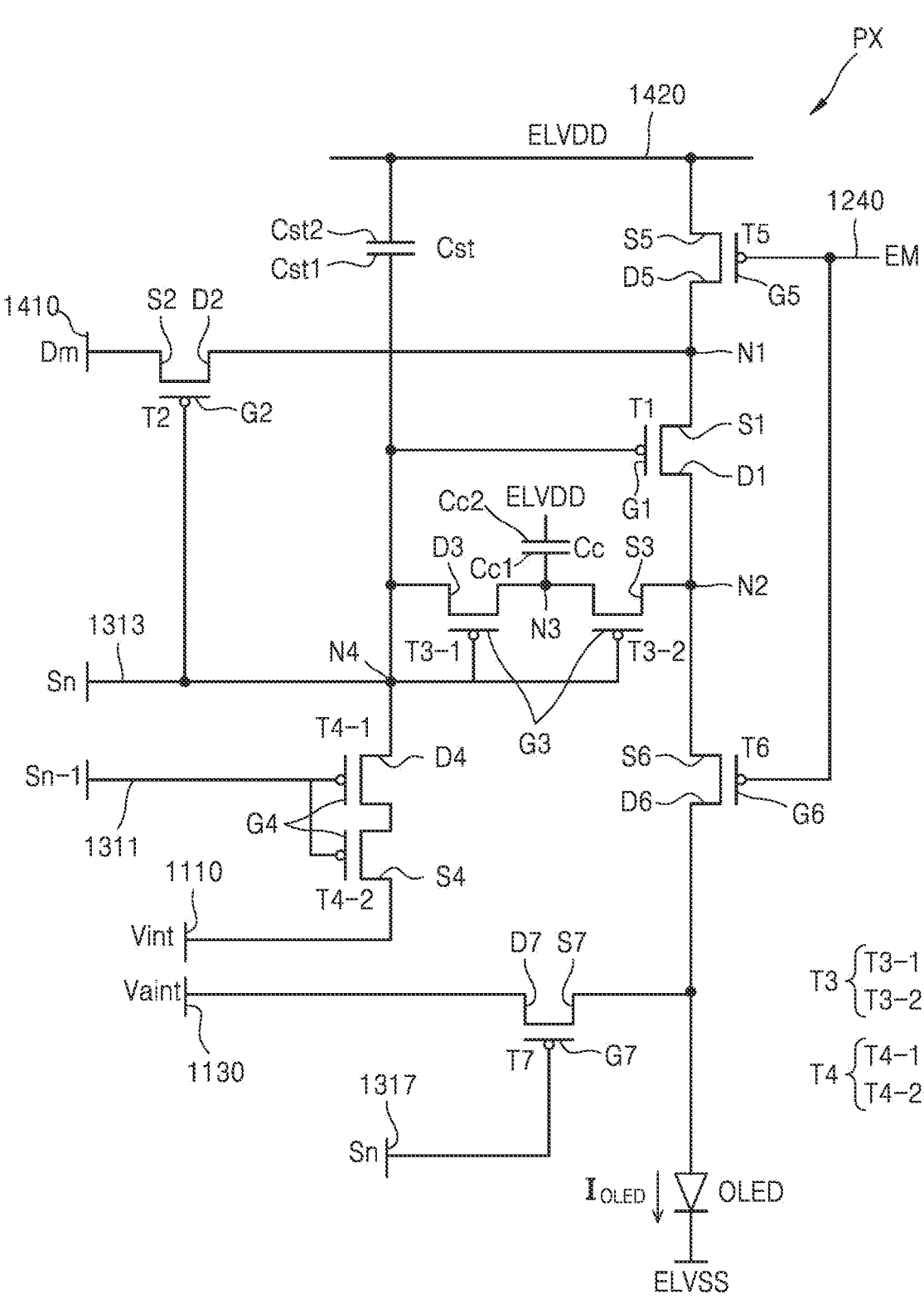
FIG. 2 is an equivalent circuit diagram of one pixel included in the display apparatus of FIG. 1.

FIG. 2 is an equivalent circuit diagram of one pixel included in the display apparatus of FIG. 1.

Referring to FIG. 2, the pixel PX includes a plurality of signal lines 1311, 1313, 1317, 1240, and 1410, a plurality of thin film transistors T1, T2, T3, T4, T5, T6, and T7 connected to respective ones of the signal lines 1311, 1313, 1317, 1240, and 1410, a storage capacitor Cst, a compensation capacitor Cc, a first initialization voltage line 1110, a second initialization voltage line 1130, and a driving voltage line 1420.

FIG. 2 illustrates a case in which the signal lines 1311, 1313, 1317, 1240, and 1410, the first initialization voltage line 1110, the second initialization voltage line 1130, and the driving voltage line 1420 are provided for each one pixel PX, but the disclosure is not limited thereto. In one or more other embodiments, at least any one of the signal lines 1311, 1313, 1317, 1240, and 1410, the first initialization voltage line 1110, the second initialization voltage line 1130, or the driving voltage line 1420 may share neighboring pixels PX.

The thin film transistors may include a driving thin film transistor (TFT) T1, a switching TFT T2, a compensation TFT T3, a first initialization TFT T4, an operation control TFT T5, an emission control TFT T6, and a second initialization TFT T7.

The signal lines 1311, 1313, 1317, 1240, and 1410 includes a first scan line 1313 and a third scan line 1317 both for transmitting a scan signal Sn, a second scan line 1311 for transmitting a previous scan signal Sn−1, an emission control line 1240 for transmitting an emission control signal EM, and a data line 1410 for transmitting a data signal Dm. The driving voltage line 1420 is configured to transmit a driving voltage ELVDD to the driving TFT T1, the first initialization voltage line 1110 is configured to transmit a first initialization voltage Vint for initializing the driving TFT T1 to the first initialization TFT T4, and the second initialization voltage line 1130 is configured to transmit a second initialization voltage Vaint to a pixel electrode of the organic light-emitting device OLED.

FIG. 2 illustrates a case in which the first initialization voltage line 1110 and the second initialization voltage line 1130 are separately provided. However, in one or more other embodiments, the second initialization voltage line 1130 may be omitted, and the first initialization voltage line 1110 may be configured to transmit the first initialization voltage Vint to the pixel electrode of the organic light-emitting device OLED.

Figure 6:
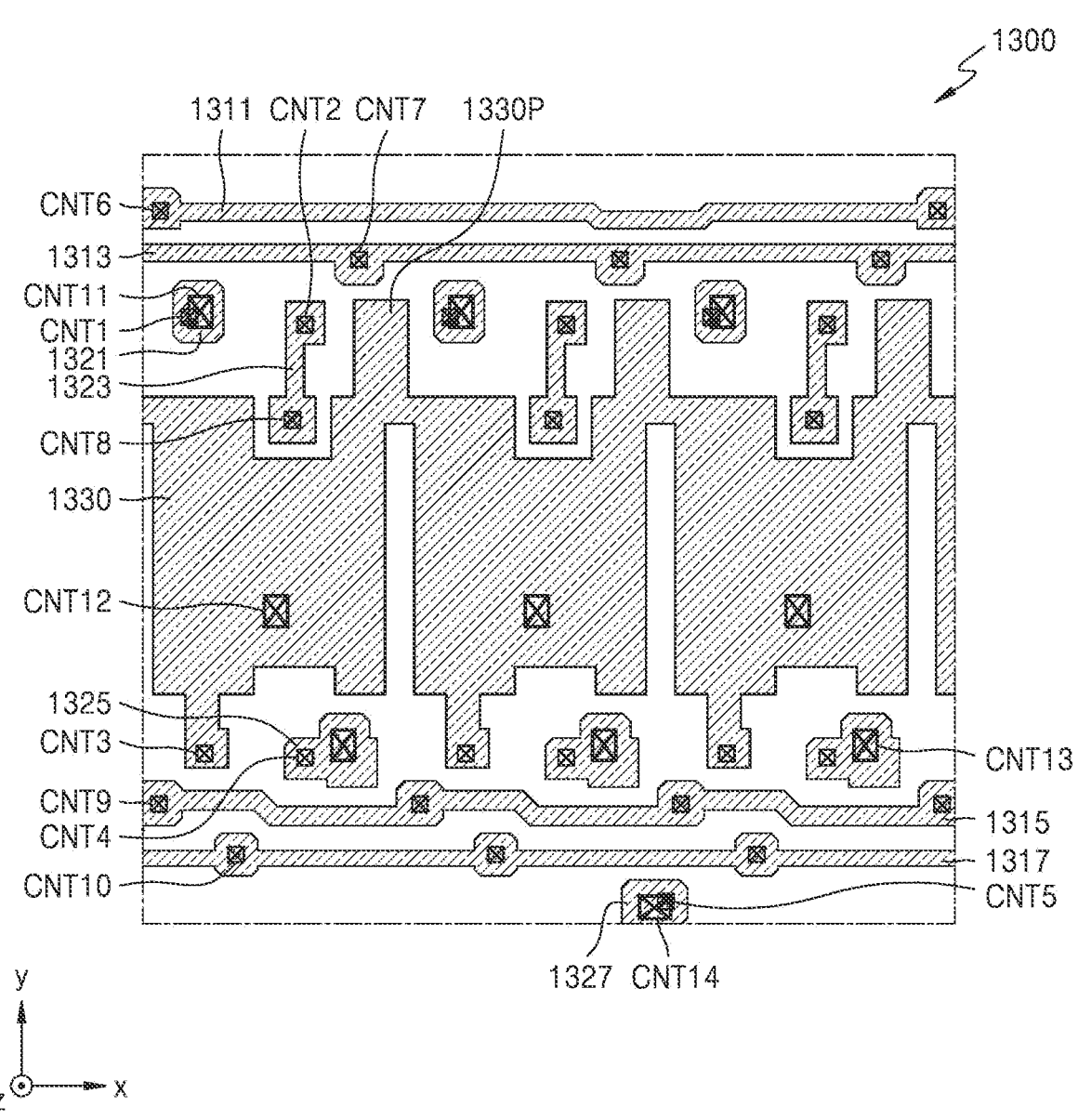
Figure 7:
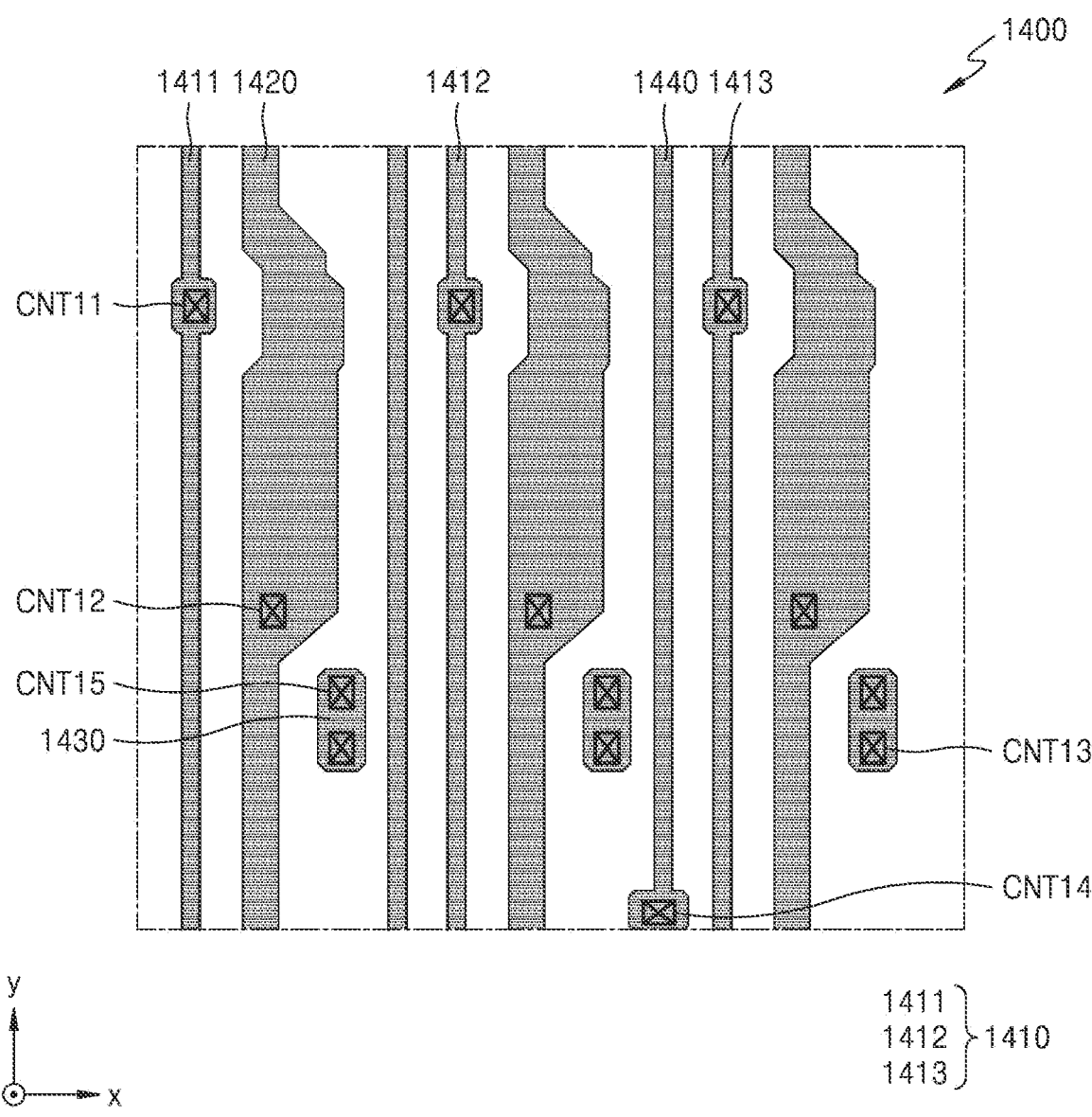

A driving gate electrode G1 of the driving TFT T1 is connected to a first storage capacitor plate Cst1 of the storage capacitor Cst, a source electrode S1 of the driving TFT T1 is connected to the driving voltage line 1420 via the operation control TFT T5 and to a first electrode 1330 (see FIG. 6), and a drain electrode D1 of the driving TFT T1 is connected to the organic light-emitting device OLED via the emission control TFT T6, thereby supplying a driving current $I_{OLED}$ to the organic light-emitting device OLED.

A switching gate electrode G2 of the switching TFT T2 is connected to the first scan line 1313 via a first wiring 1220 (see FIG. 5), a source electrode S2 of the switching TFT T2 is connected to the data line 1410, and a drain electrode D2 of the switching TFT T2 is connected to the source electrode S1 of the driving TFT T1 at a first node N1, and to the driving voltage line 1420 via the operation control TFT T5 and the first electrode 1330. The switching TFT T2 is turned on in response to the scan signal Sn received through the first scan line 1313, and performs a switching operation of transmitting the data signal Dm transmitted through the data line 1410 to the source electrode S1 of the driving TFT T1.

A compensation gate electrode G3 of the compensation TFT T3 is connected to the first scan line 1313, a source electrode S3 of the compensation TFT T3 is connected to the drain electrode D1 of the driving TFT T1 at a second node N2, and to the pixel electrode of the organic light-emitting device OLED via the emission control TFT T6, and a drain electrode D3 of the compensation TFT T3 is connected to the first storage capacitor plate Cst1 of the storage capacitor Cst, to a drain electrode D4 of the first initialization TFT T4, and to the driving gate electrode G1 of the driving TFT T1. The compensation TFT T3 is turned on in response to the scan signal Sn received through the first scan line 1313, and electrically connects the driving gate electrode G1 of the driving TFT T1 to the drain electrode D1 of the driving TFT T1, thereby having the driving TFT T1 form a diode-connection.

The compensation TFT T3 includes a first compensation TFT T3-1 and a second compensation TFT T3-2 that are connected to the first scan line 1313 and that receive the same gate voltage. A source electrode of the first compensation TFT T3-1 and a drain electrode of the second compensation TFT T3-2 are connected to a first compensation capacitor plate Cc1 of the compensation capacitor Cc at a third node N3. A second compensation capacitor plate Cc2 of the compensation capacitor Cc is connected to the driving voltage line 1420 via the first electrode 1330.

A gate electrode G4 of the first initialization TFT T4 is connected to the second scan line 1311, a source electrode S4 of the first initialization TFT T4 is connected to the first initialization voltage line 1110, the drain electrode D4 of the first initialization TFT T4 is connected to the first storage capacitor plate Cst1 of the storage capacitor Cst, to the drain electrode D3 of the compensation TFT T3, and to the driving gate electrode G1 of the driving TFT T1 at a fourth node N4. The first initialization TFT T4 is turned on in response to the previous scan signal Sn−1 received through the second scan line 1311, and transmits the first initialization voltage Vint to the driving gate electrode G1 of the driving TFT T1, thereby performing an initialization operation to initialize the voltage of the driving gate electrode G1.

A gate electrode G5 of the operation control TFT T5 is connected to the emission control line 1240, a source electrode S5 of the operation control TFT T5 is connected to the driving voltage line 1420 via the first electrode 1330, and a drain electrode D5 of the operation control TFT T5 is connected to the source electrode S1 of the driving TFT T1 and to the drain electrode D2 of the switching TFT T2, at the first node N1.

A gate electrode G6 of the emission control TFT T6 is connected to the emission control line 1240, a source electrode S6 of the emission control TFT T6 is connected to the drain electrode D1 of the driving TFT T1 and to the source electrode S3 of the compensation TFT T3 at the second node N2, and a drain electrode D6 of the emission control TFT T6 is electrically connected to a source electrode S7 of a second initialization TFT T7, and to the pixel electrode of the organic light-emitting device OLED.

The operation control TFT T5 and the emission control TFT T6 are concurrently or substantially simultaneously turned on in response to the emission control signal EM received through the emission control line 1240, and transmit the driving voltage ELVDD to the organic light-emitting device OLED, thereby causing the driving current $I_{OLED}$ to flow in the organic light-emitting device OLED.

A second initialization gate electrode G7 of the second initialization TFT T7 is connected to the third scan line 1317, the source electrode S7 of the second initialization TFT T7 is connected to the drain electrode D6 of the emission control TFT T6 and to the pixel electrode of the organic light-emitting device OLED, and a drain electrode D7 of the second initialization TFT T7 is connected to the second initialization voltage line 1130. The second initialization TFT T7 is turned on in response to the scan signal Sn received through the third scan line 1317, and transmits the second initialization voltage Vaint to the pixel electrode of the organic light-emitting device OLED, thereby initializing the pixel electrode.

FIG. 2 illustrates a case in which the second initialization TFT T7 is connected to the third scan line 1317, but the disclosure is not limited thereto. In one or more other embodiments, the second initialization TFT T7 may be connected to the second scan line 1311 to be driven in response to the previous scan signal Sn−1.

Furthermore, FIG. 2 illustrates a case in which the drain electrode D7 of the second initialization TFT T7 is connected to the second initialization voltage line 1130, as described above, in one or more other embodiments, while the second initialization voltage line 1130 may be omitted, the second initialization TFT T7 may be connected to the first initialization voltage line 1110 to transmit the first initialization voltage Vint to the pixel electrode.

A second storage capacitor plate Cst2 of the storage capacitor Cst is connected to the driving voltage line 1420 via the first electrode 1330, and a counter electrode of the organic light-emitting device OLED is connected to a common voltage ELVSS. Accordingly, the organic light-emitting device OLED may receive the driving current $I_{OLED}$ from the driving TFT T1 and may display an image by emitting light.

FIG. 2 illustrates that the compensation TFT T3 and the first initialization TFT T4 each have a dual gate electrode, but the disclosure is not limited thereto. For example, the compensation TFT T3 and/or the first initialization TFT T4 may have a single gate electrode. Furthermore, various modifications are possible such that at least any one of the thin film transistors T1, T2, T5, T6, and T7 other than the compensation TFT T3 and the first initialization TFT T4 may have a dual gate electrode.

A detailed operation of each pixel PX according to one or more embodiments is as follows.

During the initialization period, when the previous scan signal Sn−1 is supplied through the second scan line 1311, the first initialization TFT T4 is turned on in response to the previous scan signal Sn−1, and the driving TFT T1 is initialized by the first initialization voltage Vint supplied through the first initialization voltage line 1110.

During a data programming period, when the scan signal Sn is supplied through the first scan line 1313, the switching TFT T2 and the compensation TFT T3 are turned on in response to the scan signal Sn. In this state, the driving TFT T1 forms a diode-connection by the compensation TFT T3 that is turned on, and is biased in a forward direction.

Then, a compensation voltage (Dm+Vth), where Vth is a (−) value, the compensation voltage being obtained by subtracting a threshold voltage Vth of the driving TFT T1 from the data signal Dm supplied through the data line 1410, and being applied to the driving gate electrode G1 of the driving TFT T1.

The driving voltage ELVDD and the compensation voltage (Dm+Vth) are applied to both ends of the storage capacitor Cst, and the storage capacitor Cst stores electric charges corresponding to a voltage difference between both ends.

During an emission period, the operation control TFT T5 and the emission control TFT T6 are turned on by the emission control signal EM supplied through the emission control line 1240. The driving current $I_{OLED}$ is generated according to a difference between the voltage of the driving gate electrode G1 of the driving TFT T1 and the voltage of the driving voltage ELVDD, and the driving current $I_{OLED}$ is supplied to the organic light-emitting device OLED via the emission control TFT T6.

Figure 3:
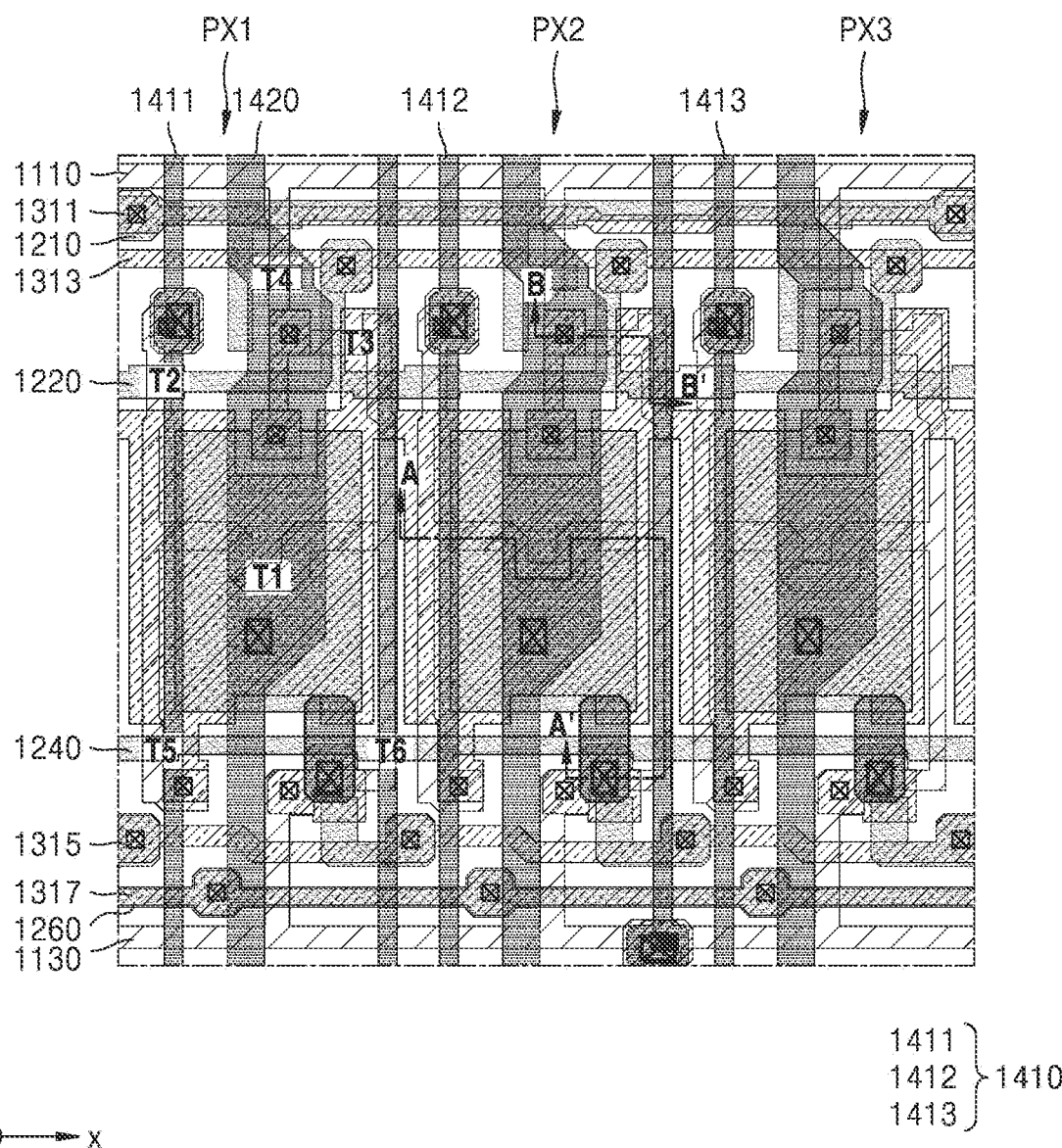
FIG. 3 is a schematic layout showing the locations of a plurality of thin film transistors, a storage capacitor, and a compensation capacitor of FIG. 2.
Figure 8:
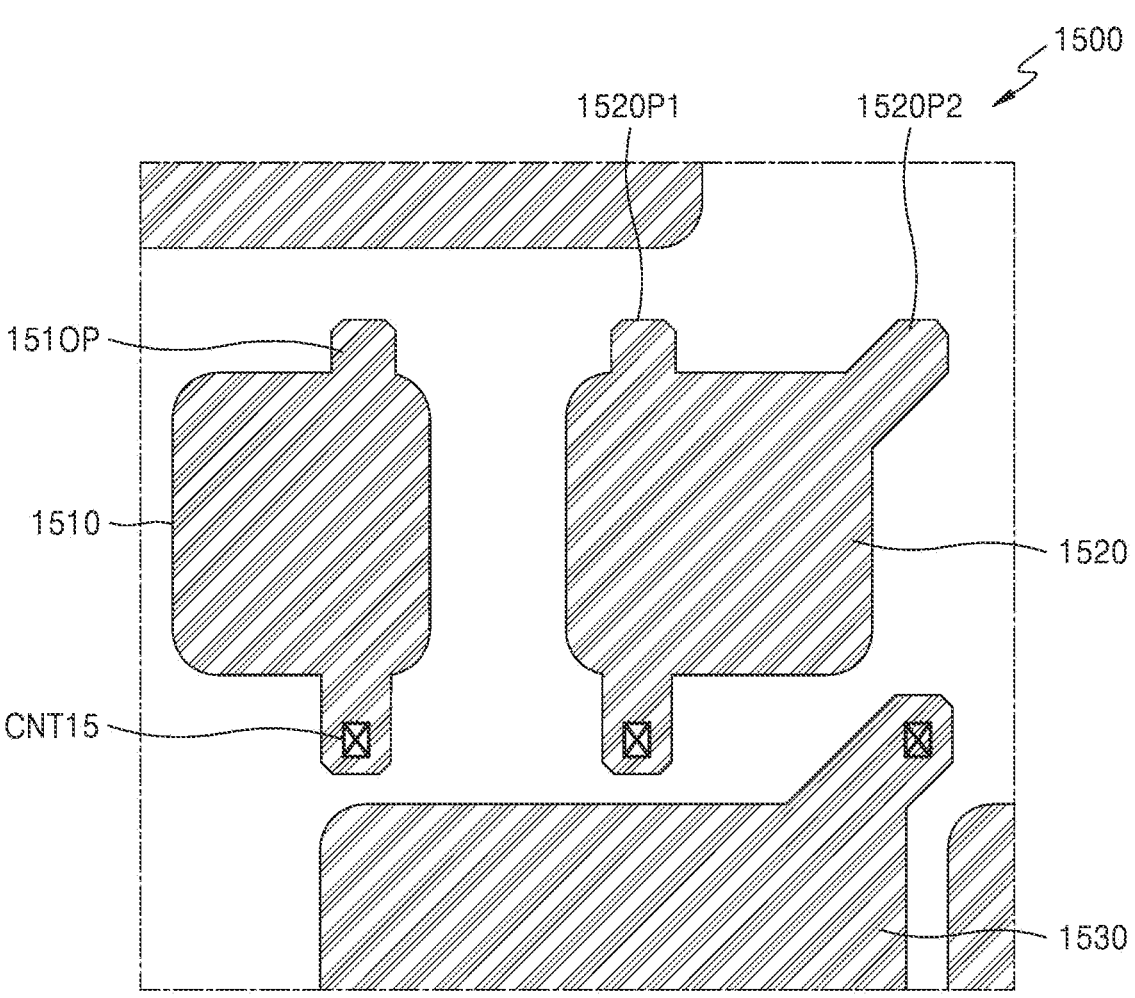
FIG. 8 is a schematic layout showing the locations of pixel electrodes.
Figure 8:
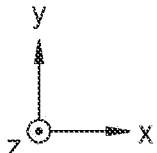
Figure 9:
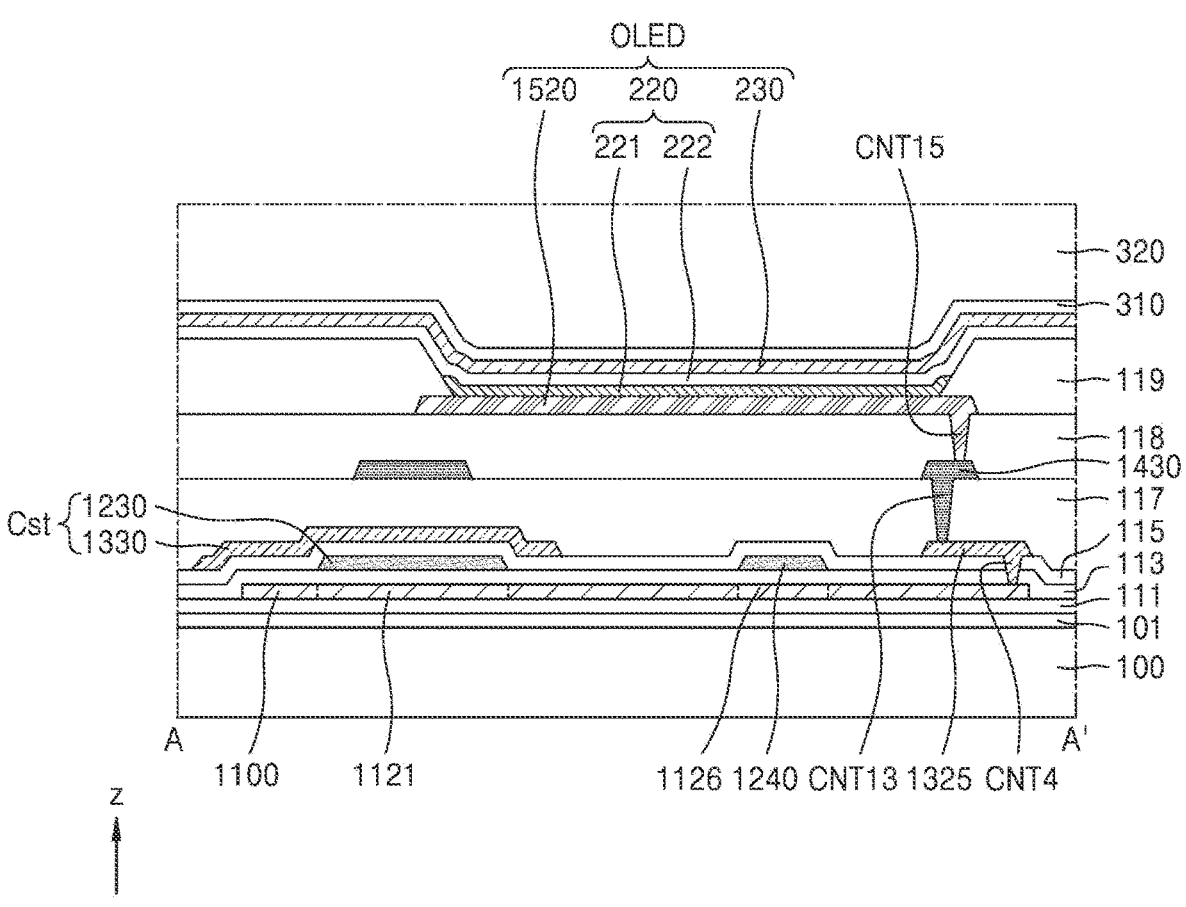
FIG. 9 is a cross-sectional view of the display apparatus taken along line A-A' of FIG. 3.
Figure 10:
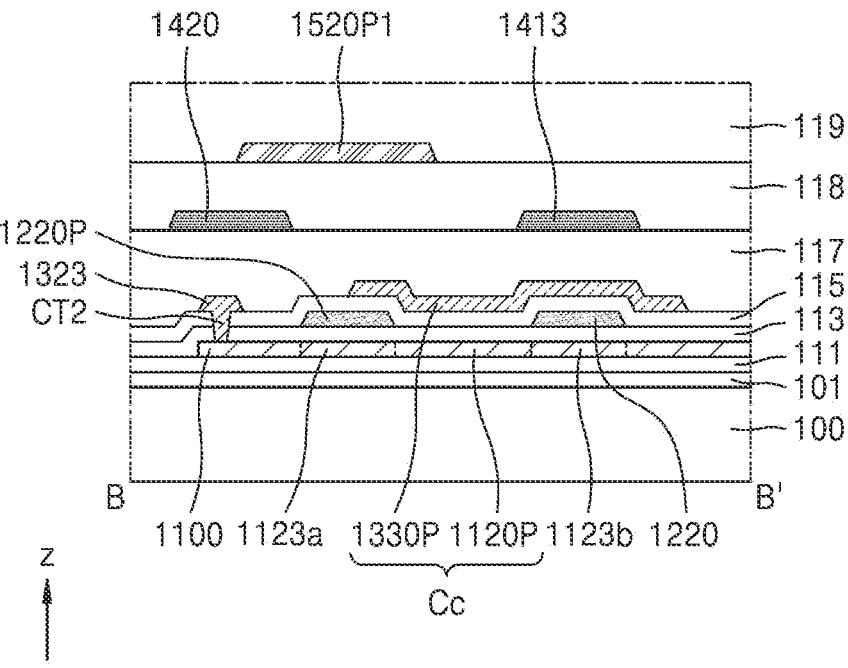
FIG. 10 is a cross-sectional view of the display apparatus taken along line B-B' of FIG. 3.

FIG. 3 is a schematic layout showing the locations of the thin film transistors, the storage capacitor, and the compensation capacitor of FIG. 2. FIGS. 4 to 7 are schematic layouts showing, by layers, constituent elements such as the thin film transistors, the storage capacitor, and the compensation capacitor of FIG. 3. FIG. 8 is a schematic layout showing the locations of the pixel electrodes. FIG. 9 is a cross-sectional view of the display apparatus taken along line A-A' of FIG. 3, and FIG. 10 is a cross-sectional view of the display apparatus taken along line B-B' of FIG. 3.

FIGS. 4 to 8 respectively illustrate the layout of the wiring, the electrode, the semiconductor layer, and the like that are located on the same layer, and one or more insulating layers may be interposed between the layers illustrated in FIGS. 4 to 8. For example, a gate insulating layer 113 (see FIG. 9) is interposed between a semiconductor layer 1100 of FIG. 4 and a first conductive layer 1200 of FIG. 5. Further, an interlayer insulating layer 115 (see FIG. 9) is interposed between the first conductive layer 1200 of FIG. 5 and a second conductive layer 1300 of FIG. 6. Also, a first planarization layer 117 (see FIG. 9) is interposed between the second conductive layer 1300 of FIG. 6 and a third conductive layer 1400 of FIG. 7. Additionally, a second planarization layer 118 (see FIG. 9) is interposed between the third conductive layer 1400 of FIG. 7 and a fourth conductive layer 1500 of FIG. 8. The layers illustrated in FIGS. 4 to 8 may be electrically connected to each other through one or more contact holes defined in at least some of the insulating layers described above.

Referring to FIG. 3, a first pixel PX1, a second pixel PX2, and a third pixel PX3 may be located in a first direction, for example, an x direction. The first to third pixels PX1, PX2, and PX3 may share the first initialization voltage line 1110, the second initialization voltage line 1130, the first scan line 1313, the second scan line 1311, the third scan line 1317, and the emission control line 1240, which extend in the first direction.

Each of the first to third pixels PX1, PX2, and PX3 may extend in a second direction (e.g., a y direction) to cross the first initialization voltage line 1110, the second initialization voltage line 1130, the first scan line 1313, the second scan line 1311, the third scan line 1317, and the emission control line 1240, and may include the data line 1410 for applying the data signal Dm and the driving voltage line 1420.

Each of the first to third pixels PX1, PX2, and PX3 includes the thin film transistors T1, T2, T3, T4, T5, T6, and T7, the storage capacitor Cst, the compensation capacitor Cc, and the organic light-emitting device OLED that is electrically connected thereto. In the following description, for convenience of explanation, the above-described constituent elements are described in an order of stacking.

Referring to FIGS. 3, 4, 9, and 10, the semiconductor layer 1100 includes the first initialization voltage line 1110 and the second initialization voltage line 1130 that extend in the first direction, and a plurality of semiconductor patterns 1120 connected to the first initialization voltage line 1110 and the second initialization voltage line 1130.

The semiconductor layer 1100 may be located on a buffer layer 111 located on the substrate 100. The substrate 100 may be formed of a glass material, a metal material, or a plastic material such as polyethylene terephthalate (PET), polyethylene naphthalate (PEN), polyimide, and the like. The buffer layer 111 may include an oxide film such as a silicon oxide (SiOx), and/or a nitride film such as a silicon nitride (SiNx).

The semiconductor layer 1100 may be formed of polycrystalline silicon. For example, the first initialization voltage line 1110, the second initialization voltage line 1130, and the semiconductor patterns 1120 may be formed of polycrystalline silicon.

The semiconductor patterns 1120 may include a channel region 1121 of the driving TFT T1, a channel region 1122 of the switching TFT T2, a channel region 1123a of the first compensation TFT T3-1, a channel region 1123b of the second compensation TFT T3-2, a channel region 1124 of the first initialization TFT T4, a channel region 1125 of the operation control TFT T5, a channel region 1126 of the emission control TFT T6, and a channel region 1127 of the second initialization TFT T7. The semiconductor patterns 1120 are connected to each other to be provided as one body, and may be curved in various shapes.

The semiconductor patterns 1120 may include a source region and a drain region at both sides of each of channel regions. In an example, the source region and the drain region may be doped with impurities, and the impurities may include N-type impurities or P-type impurities. The source region and the drain region correspond to a source electrode and a drain electrode, respectively. In the following description, terms such as a source region and a drain region are used instead of the source electrode and the drain electrode.

The channel region 1121 of the driving TFT T1 may be longer than other channel regions 1122 to 1127. For example, as the channel region 1121 of the driving TFT T1 may have a shape bent multiple times, such as a character "omega" or "S", a long channel length may be formed in a narrow space. As the channel region 1121 of the driving TFT T1 is formed long, the driving range of a gate voltage applied to a gate electrode 1230 of the driving TFT T1 is broaden so that the gradation of light emitted from the organic light-emitting device OLED may be controlled more accurately, thereby improving display quality.

The source region and the drain region of the driving TFT T1 may extend from both sides of the channel region 1121 of the driving TFT T1.

The source region and the drain region of the switching TFT T2 may extend from both sides of the channel region 1122 of the switching TFT T2. The source region of the switching TFT T2 is connected to the data line 1410 through a first contact hole CNT1 and an eleventh contact hole CNT11 (see FIG. 6). The drain region of the switching TFT T2 is connected to the source region of the driving TFT T1 and the drain region of the operation control TFT T5.

The compensation TFT T3 may include the first compensation TFT T3-1 and the second compensation TFT T3-2 as a dual thin film transistor. In one or more embodiments, the semiconductor patterns 1120 may include a node portion 1120P that includes a first pattern 1120P1 arranged in the first direction (x direction), and a second pattern 1120P2 meeting one end of the first pattern 1120P1 and arranged in the second direction (y direction). For example, the first pattern 1120P1 and the second pattern 1120P2, as parts of the semiconductor patterns 1120, may be continuously provided as one body. The first pattern 1120P1 may include the channel region 1123a of the first compensation TFT T3-1, and the second pattern 1120P2 may include the channel region 1123b of the second compensation TFT T3-2. In this state, a point where the first pattern 1120P1 and the second pattern 1120P2 meet may be defined as the third node N3 (see FIG. 2).

In the node portion 1120P, a region between the channel region 1123a of the first compensation TFT T3-1 and the channel region 1123b of the second compensation TFT T3-2 may be doped with impurities, and locally, may be the source region of the first compensation TFT T3-1 and also may correspond to the drain region of the second compensation TFT T3-2 and to the first compensation capacitor plate Cc1 of the compensation capacitor Cc.

The drain region may extend from one side of the first compensation TFT T3-1, and the source region may extend from the other side of the second compensation TFT T3-2. The drain region of the first compensation TFT T3-1 is connected to the driving gate electrode 1230 through a second contact hole CNT2, through a second island 1323 (see FIG. 6), and through an eighth contact hole CNT8, and may be connected to the drain region of the first initialization TFT T4. The source region of the second compensation TFT T3-2 may be connected to the drain region of the driving TFT T1 and to the source region of the emission control TFT T6.

The first initialization TFT T4 may be a dual thin film transistor. In one or more embodiments, the first initialization TFT T4 may include a first-1 initialization channel region 1124a and a first-2 initialization channel region 1124b. A region between the first-1 initialization channel region 1124a and the first-2 initialization channel region 1124b may be doped with impurities, and locally, may be a source region of any one of the dual thin film transistor, and also may correspond to a drain region of the other. The source region of the first initialization TFT T4 may extend from one side of the first-1 initialization channel region 1124a, and may be connected to the first initialization voltage line 1110. The drain region of the first initialization TFT T4 may extend from the other side of the first-2 initialization channel region 1124b, and may be connected to the drain region of the first compensation TFT T3-1, and may be connected to the driving gate electrode 1230 through the second contact hole CNT2, through the second island 1323, and through the eighth contact hole CNT8.

The source region and the drain region of the operation control TFT T5 may extend from both sides of the channel region 1125 of the operation control TFT T5. The drain region of the operation control TFT T5 is connected to the source region of the driving TFT T1 and to the drain region of the switching TFT T2. The source region of the operation control TFT T5 may be connected to the driving voltage line 1420 via a third contact hole CNT3 and the first electrode 1330.

The source region and the drain region of the emission control TFT T6 may extend from both sides of the channel region 1126 of the emission control TFT T6. The source region of the emission control TFT T6 may be connected to the source region of the second compensation TFT T3-2 and to the drain region of the driving TFT T1. The drain region of the emission control TFT T6 may be connected to the source region of the second initialization TFT T7, and to a pixel electrode 1510 (see FIG. 8) via a fourth contact hole CNT4, a third island 1325 (see FIG. 6), a thirteenth contact hole CNT13 (see FIG. 6), a connection electrode 1430 (see FIG. 7), and a fifth contact hole CNT15 (see FIG. 7).

The source region and the drain region of the second initialization TFT T7 may extend from both sides of the channel region 1127 of the second initialization TFT T7. The source region of the second initialization TFT T7 may be connected to the drain region of the emission control TFT T6, and to the pixel electrode 1510 via the fourth contact hole CNT4, the third island 1325, the thirteenth contact hole CNT13, the connection electrode 1430, and the fifth contact hole CNT15. The drain region of the second initialization TFT T7 may be connected to the second initialization voltage line 1130.

Figure 4:
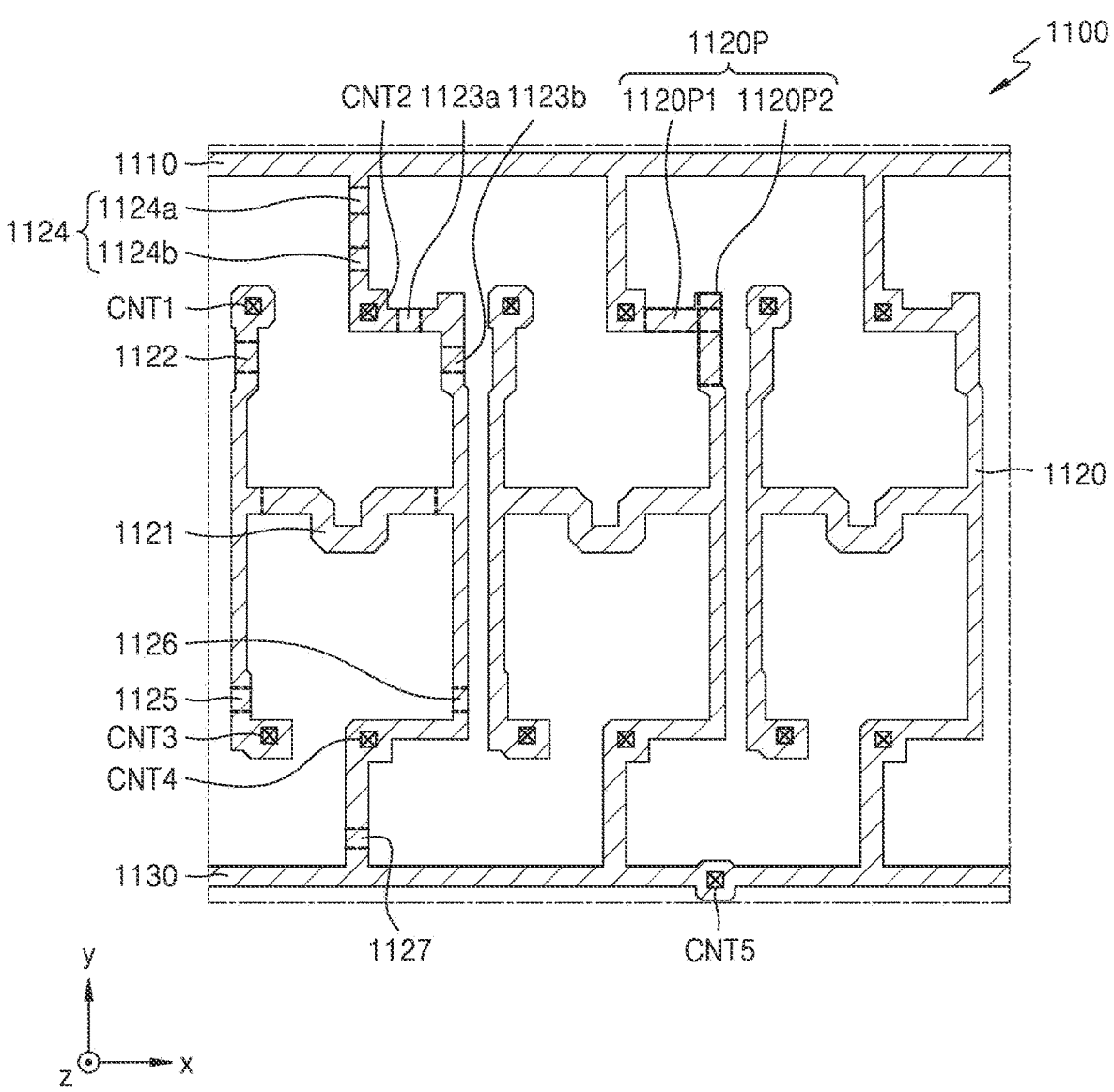
FIGS. 4 to 7 are schematic layouts showing, by layers, constituent elements such as the thin film transistors, the storage capacitor, and the compensation capacitor of FIG. 3.

The second initialization voltage line 1130 may be connected to an upper second initialization voltage line 1440 (see FIG. 7) extending in the second direction (y direction) through the fifth contact hole CNT5, a fourth island 1327 (see FIG. 6), and a fourteenth contact hole CNT14. FIG. 4 illustrates that the first initialization voltage line 1110 and the second initialization voltage line 1130 are separately provided. In one or more other embodiments, the second initialization voltage line 1130 may be omitted. In the following description, a case in which the first initialization voltage line 1110 and the second initialization voltage line 1130 are separately provided is mainly descried.

The first initialization voltage line 1110, the semiconductor patterns 1120, and the second initialization voltage line 1130 may be provided as one body. Furthermore, the first initialization voltage line 1110, the semiconductor patterns 1120, and the second initialization voltage line 1130 may include the same material.

The gate insulating layer 113 is located on the semiconductor layer 1100. The gate insulating layer 113 may include an inorganic material including an oxide or a nitride. For example, the gate insulating layer 113 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$) or the like.

Referring to FIGS. 3, 5, 9, and 10, the first conductive layer 1200 is located on the gate insulating layer 113. The first conductive layer 1200 may include a second lower scan line 1210, a first wiring 1220, the emission control line 1240, a third lower scan line 1260, and the driving gate electrode 1230. The second lower scan line 1210, the first wiring 1220, the emission control line 1240, the third lower scan line 1260, and the driving gate electrode 1230 may include the same material. For example, the second lower scan line 1210, the first wiring 1220, the emission control line 1240, the third lower scan line 1260, and the driving gate electrode 1230 may include molybdenum (Mo), aluminum (Al), copper (Cu), titanium (Ti), and the like, and may be a single layer or a multilayer.

The second lower scan line 1210 is connected to the second scan line 1311 through a sixth contact hole CNT6. The second lower scan line 1210 may overlap the first-1 initialization channel region 1124a of the first initialization TFT T4, and function as a gate electrode 1214a of the first initialization TFT T4. In one or more embodiments, the second lower scan line 1210 may further include a protruding wiring that protrudes in a third direction (for example, a −y direction, which is opposite to a second direction) crossing the first direction (x direction), and may extend in the first direction (x direction). The protruding wiring may overlap the first-2 initialization channel region 1124b of the first initialization TFT T4, and may function as a gate electrode 1214b of the first initialization TFT T4.

The first wiring 1220 may extend in the first direction (x direction), and may include a second wiring 1220P that protrudes in the second direction (y direction) crossing the first direction (x direction). The first wiring 1220 partially overlaps and crosses the second pattern 1120P2 of the semiconductor pattern 1120 (see FIG. 4), and the second wiring 1220P partially overlaps and crosses the first pattern 1120P1 of the semiconductor patterns 1120.

The second wiring 1220P is connected to the first scan line 1313 through a seventh contact hole CNT7. The first wiring 1220 may include a gate electrode 1222 of the switching TFT T2 overlapping the channel region 1122 of the switching TFT T2, and may include a gate electrode 1213b of the second compensation TFT T3-2 overlapping the channel region 1123b of the second compensation TFT T3-2. The second wiring 1220P may include a gate electrode 1213a of the first compensation TFT T3-1 overlapping the channel region 1123a of the first compensation TFT T3-1. The gate electrode 1213a of the first compensation TFT T3-1 and the gate electrode 1213b of the second compensation TFT T3-2, as a dual gate electrode, may prevent or reduce the generation of a leakage current.

The driving gate electrode 1230, which is of an island type, overlaps the channel region 1121 of the driving TFT T1. The driving gate electrode 1230 may function as the gate electrode of the driving TFT T1, and concurrently or substantially simultaneously function as the first storage capacitor plate Cst1 (see FIG. 2) of the storage capacitor Cst. In other words, it may be understood that the driving gate electrode 1230 and the first storage capacitor plate Cst1 form one body.

The emission control line 1240 may extend in the first direction (x direction), and includes a gate electrode 1245 of the operation control TFT T5 overlapping the channel region 1125 of the operation control TFT T5, and a gate electrode 1246 of the emission control TFT T6 overlapping the channel region 1126 of the emission control TFT T6.

A third lower scan line 1260 is connected to the third scan line 1317 through a tenth contact hole CNT10. The third lower scan line 1260 includes a gate electrode 1267 of the second initialization TFT T7 overlapping the channel region 1127 of the second initialization TFT T7.

Figure 5:
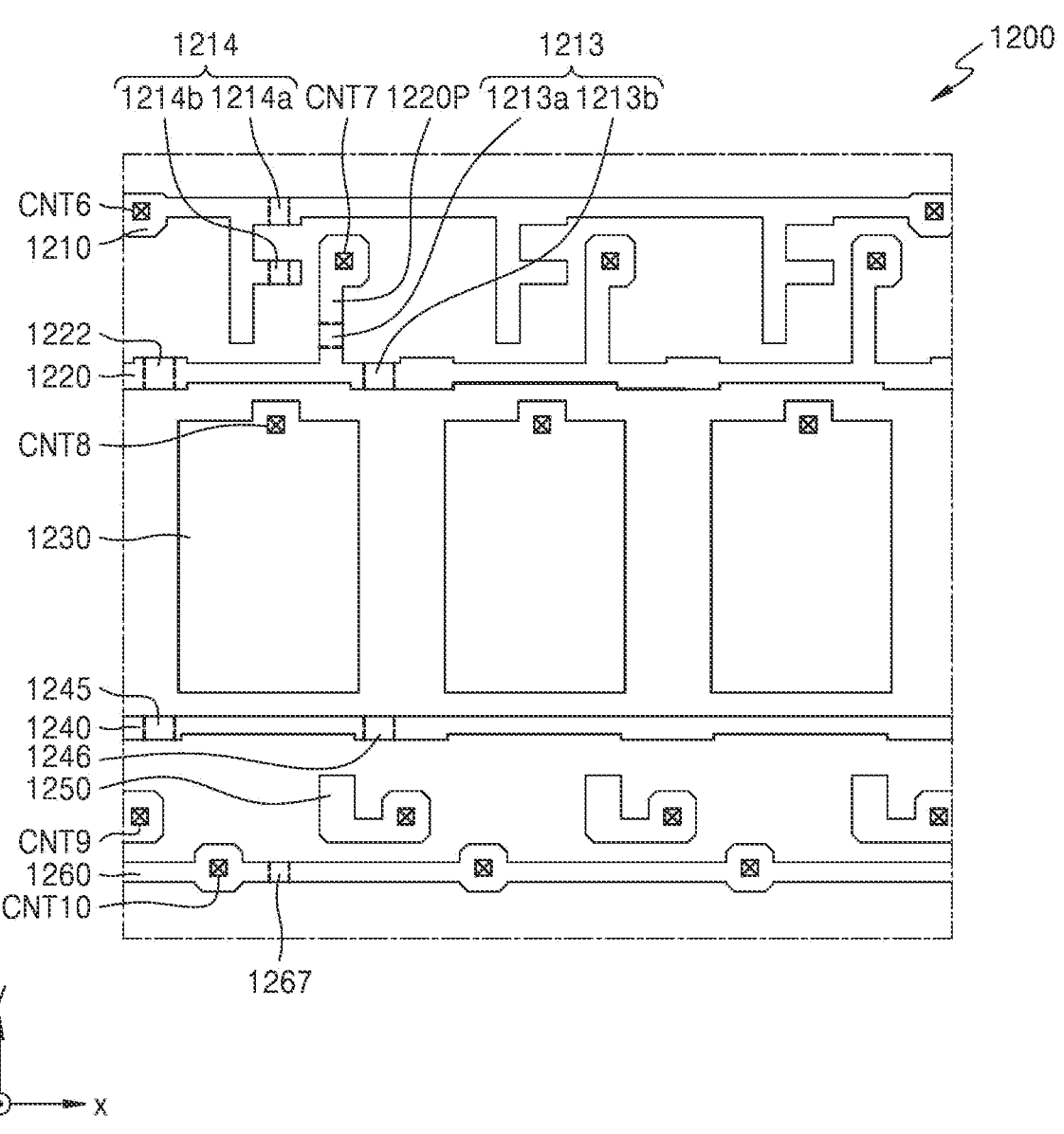

In one or more embodiments, as illustrated in FIG. 5, the first conductive layer 1200 may include a repair electrode 1250. The repair electrode 1250 may be connected to a repair line 1315 (see FIG. 6) through a ninth contact hole CNT9. A part of the repair electrode 1250 may be connected to the second initialization voltage line 1130 via a third island 1325. When a defect occurs in a pixel circuit, a laser beam is irradiated onto a partial region of the repair electrode 1250 to make the region short-circuited, the organic light-emitting device OLED corresponding thereto does not always emit light, and a corresponding pixel may become a dark spot.

The interlayer insulating layer 115 is located on the first conductive layer 1200. The interlayer insulating layer 115 may include an inorganic material including an oxide or a nitride. For example, the interlayer insulating layer 115 may include $SiO_2$, SiNx, SiON, $Al_2O_3$, $TiO_2$, $Ta_2O_5$, $HfO_2$, $ZnO_2$, or the like.

Referring to FIGS. 3, 6, 9, and 10, the second conductive layer 1300 is located on the interlayer insulating layer 115. The second conductive layer 1300 may include the first scan line 1313, the second scan line 1311, the third scan line 1317, the first electrode 1330, a first island 1321, the second island 1323, the third island 1325, and a fourth island 1327. The first scan line 1313, the second scan line 1311, the third scan line 1317, the first electrode 1330, the first island 1321, the second island 1323, the third island 1325, and the fourth island 1327 may include the same material. For example, the first scan line 1313, the second scan line 1311, the third scan line 1317, the first electrode 1330, the first island 1321, the second island 1323, the third island 1325, and the fourth island 1327 may include a conductive material including Mo, Al, Cu, Ti, and the like, and may be formed in a multilayer or single layer including the above material. In an example, the first scan line 1313, the second scan line 1311, the third scan line 1317, the first electrode 1330, the first island 1321, the second island 1323, the third island 1325, and the fourth island 1327 may have a multilayer structure of Ti/Al/Ti.

The first scan line 1313 may extend in the first direction (x direction), and is connected to the second wiring 1220P of the first conductive layer 1200 through the seventh contact hole CNT7 that penetrates the interlayer insulating layer 115.

The second scan line 1311 may extend in the first direction (x direction), and is connected to the second lower scan line 1210 of the first conductive layer 1200 through the sixth contact hole CNT6 that penetrates the interlayer insulating layer 115. When viewed from a direction perpendicular to an upper surface of the substrate 100, the second scan line 1311 and the second lower scan line 1210 may overlap each other.

The first island 1321 is connected to the source region of the switching TFT T2 of the semiconductor layer 1100 through the first contact hole CNT1 that penetrates the gate insulating layer 113 and the interlayer insulating layer 115, and to the data line 1410 of the third conductive layer 1400 through an eleventh contact hole CNT11 that penetrates the first planarization layer 117.

The second island 1323 is connected to the drain region of the first compensation TFT T3-1 of the semiconductor layer 1100 through the second contact hole CNT2 that penetrates the gate insulating layer 113 and the interlayer insulating layer 115, and to the driving gate electrode 1230 of the first conductive layer 1200 through the eighth contact hole CNT8 that penetrates the interlayer insulating layer 115.

The first electrode 1330, when viewed from a direction perpendicular to the upper surface of the substrate 100, overlaps the driving gate electrode 1230, and includes a protruding electrode 1330P protruding in the second direction (y direction). The first electrode 1330 is connected to the source region of the operation control TFT T5 of the semiconductor layer 1100 through the third contact hole CNT3 that penetrates the gate insulating layer 113 and the interlayer insulating layer 115, and to the driving voltage line 1420 of the third conductive layer 1400 through a twelfth contact hole CNT12 that penetrates the first planarization layer 117. The first electrode 1330 overlaps the driving gate electrode 1230 and may function as the second storage capacitor plate Cst2 of the storage capacitor Cst. The protruding electrode 1330P may overlap a part of the node portion 1120P of the semiconductor layer 1100, and may function as the second compensation capacitor plate Cc2 of the compensation capacitor Cc. In other words, a part of the first pattern 1120P1 and a part of the second pattern 1120P2 that correspond to a region between the channel region 1123a of the first compensation TFT T3-1 and the channel region 1123b of the second compensation TFT T3-2 may function as the first compensation capacitor plate Cc1 of the compensation capacitor Cc, and the protruding electrode 1330P that overlaps the part of the first pattern 1120P1 and the part of the second pattern 1120P2 may function as the second compensation capacitor plate Cc2.

The protruding electrode 1330P, when viewed from the direction perpendicular to the upper surface of the substrate 100, may overlap a part of the data line 1410 of the third conductive layer 1400, and may cover the node portion 1120P of the semiconductor layer 1100 from the data line 1410. Accordingly, a change in the luminance of the organic light-emitting device OLED because the first compensation TFT T3-1 and the second compensation TFT T3-2 adjacent to the data line 1410 are affected by the data signal DM applied to the data line 1410 may be prevented or reduced. In one or more embodiments, the capacitance of the compensation capacitor Cc may be about 50% or more of the capacitance of the storage capacitor Cst. In one or more other embodiments, the capacitance of the compensation capacitor Cc may be about 70% or more of the capacitance of the storage capacitor Cst.

The first electrode 1330 may include a plurality of first electrodes located in the first direction (x direction), and the first electrodes 1330 adjacent thereto may be connected to each other through a connection portion and provided as one body. The first electrode 1330 and the driving voltage line 1420 of the third conductive layer 1400 may form a mesh structure.

The third island 1325 is connected to the drain region of the emission control TFT T6 and the source region of the second initialization TFT T7 through the fourth contact hole CNT4 that penetrates the gate insulating layer 113 and the interlayer insulating layer 115, and to a connection electrode 1430 of the third conductive layer 1400 through a thirteenth contact hole CNT13 that penetrates the first planarization layer 117.

The third scan line 1317 may extend in the first direction (x direction), and may be connected to the third lower scan line 1260 through the tenth contact hole CNT10 that penetrates the interlayer insulating layer 115. When viewed from the direction perpendicular to the upper surface of the substrate 100, the third scan line 1317 and the third lower scan line 1260 may overlap each other.

In one or more embodiments, the second conductive layer 1300 may further include a repair line 1315 extending in the first direction (x direction). The repair line 1315 may be connected to the repair electrode 1250 through the ninth contact hole CNT9 that penetrates the interlayer insulating layer 115.

The fourth island 1327 may connect the second initialization voltage line 1130 of the semiconductor layer 1100 to the upper second initialization voltage line 1440 of the third conductive layer 1400 through the fifth contact hole CNT5 that penetrates the gate insulating layer 113 and the interlayer insulating layer 115, and through the fourteenth contact hole CNT14 that penetrates the first planarization layer 117.

The first planarization layer 117 is located on the second conductive layer 1300. The first planarization layer 117 may include an organic material such as acryl, benzocyclobutene (BCB), polyimide, hexamethyldisiloxane (HMDSO), or the like. Alternatively, the first planarization layer 117 may include an inorganic material.

Referring to FIGS. 3, 7, 9, and 10, the third conductive layer 1400 is located on the first planarization layer 117. The third conductive layer 1400 may include the data line 1410, the driving voltage line 1420, the connection electrode 1430, and the upper second initialization voltage line 1440. The data line 1410, the driving voltage line 1420, the connection electrode 1430, and the upper second initialization voltage line 1440 may include the same material. For example, the data line 1410, the driving voltage line 1420, the connection electrode 1430, and the upper second initialization voltage line 1440 may include a conductive material including Mo, Al, Cu, Ti, and the like, and may be formed in a multilayer or single layer including the above material. In an example, the data line 1410, the driving voltage line 1420, the connection electrode 1430, and the upper second initialization voltage line 1440 may have a multilayer structure of Ti/Al/Ti.

The data line 1410 may include a first data line 1411 connected to the first pixel PX1, a second data line 1412 connected to the second pixel PX2, and a third data line 1413 connected to the third pixel PX3. Each data line 1410 may extend in the second direction (y direction). The data line 1410 is connected to the first island 1321 of the second conductive layer 1300 through the eleventh contact hole CNT11 that penetrates the first planarization layer 117.

When viewed from the direction perpendicular to the upper surface of the substrate 100, the data line 1410, the protruding electrode 1330P of the second conductive layer 1300, and the node portion 1120P of the semiconductor layer 1100 may overlap one another. The protruding electrode 1330P forms one body with the first electrode 1330 to which a constant voltage is applied, and may prevent or reduce a crosstalk phenomenon due to a signal change of the data line 1410.

The driving voltage line 1420 may extend in the second direction (y direction), and is connected to the first electrode 1330 through the twelfth contact hole CNT12 that penetrates the first planarization layer 117. The first electrodes 1330 that are connected to the driving voltage lines 1420 of the neighboring pixels PX1, PX2, and PX3 in the first direction (x direction), forming one body, may form a mesh structure, and a voltage drop of the driving voltage line 1420 may be reduced or prevented.

The connection electrode 1430 is connected to the third island 1325 through the thirteenth contact hole CNT13 that penetrates the first planarization layer 117, and to the pixel electrode through a fifth contact hole CNT15 that penetrates the second planarization layer 118.

The second planarization layer 118 is located on the third conductive layer 1400. The second planarization layer 118 may include an organic material such as acryl, BCB, polyimide, HMDSO, or the like. Alternatively, the second planarization layer 118 may include an inorganic material.

Referring to FIGS. 3, 8, 9, and 10, the fourth conductive layer 1500 is located on the second planarization layer 118. The fourth conductive layer 1500 may include a first pixel electrode 1510, a second pixel electrode 1520, and a third pixel electrode 1530. The first pixel electrode 1510, the second pixel electrode 1520, and the third pixel electrode 1530 may include the same material. The first pixel electrode 1510, the second pixel electrode 1520, and the third pixel electrode 1530 may be reflective electrodes. For example, the first pixel electrode 1510, the second pixel electrode 1520, and the third pixel electrode 1530 may include a reflective film formed of Ag, Mg, Al, Pt, Pd, Au, Ni, Nd, Ir, Cr, and a compound thereof, and a transparent or semi-transparent electrode layer formed on the reflective film. The transparent or semi-transparent electrode layer may include at least one selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The first pixel electrode 1510 may correspond the first pixel PX1, the second pixel electrode 1520 may correspond to the second pixel PX2, and the third pixel electrode 1530 may correspond to the third pixel PX3. When viewed from the direction perpendicular to the upper surface of the substrate 100, the first pixel electrode 1510 may overlap the semiconductor patterns 1120 of the first pixel PX1, and the second pixel electrode 1520 may overlap the semiconductor patterns 1120 of the second pixel PX2 as well as the semiconductor patterns 1120 of the third pixel PX3.

The first pixel electrode 1510 and the second pixel electrode 1520 may have a protruding portion that covers the first pattern 1120P1 of each of the semiconductor patterns 1120 that overlap each other. For example, when viewed in a plane, a protruding portion 1510P of the first pixel electrode 1510 may overlap the first pattern 1120P1 of the semiconductor patterns 1120 of the first pixel PX1. The second pixel electrode 1520 may include a first protruding portion 1520P1 overlapping the first pattern 1120P1 of the semiconductor patterns 1120 of the second pixel PX2, and also including a second protruding portion 1520P2 overlapping the first pattern 1120P1 of the semiconductor patterns 1120 of the third pixel PX3.

The first pixel electrode 1510 and the second pixel electrode 1520 may be alternately arranged in the first direction (x direction). The third pixel electrode 1530 may be located apart from the first pixel electrode 1510 and the second pixel electrode 1520 in the second direction (y direction). Likewise, the third pixel electrode 1530, and the first pixel electrode 1510 and the second pixel electrode 1520 may be alternately arranged in the second direction (y direction). In one or more embodiments, as the third pixel electrode 1530 does not overlap the first pattern 1120P1 of the semiconductor patterns 1120, the third pixel electrode 1530 may omit the protruding portion.

As illustrated in FIG. 9, a pixel defining layer 119 and an intermediate layer 220 including an emission layer 221 and a functional layer 222 may be located on the pixel electrodes 1510, 1520, and 1530.

The pixel defining layer 119 may include at least one organic insulating material selected from the group consisting of polyimide, polyamide, acryl resin, BCB, and phenol resin. The pixel defining layer 119 has an opening for exposing the center portion of each of the pixel electrodes 1510, 1520, and 1530 and defines a light-emitting area of each organic light-emitting device OLED. Furthermore, the pixel defining layer 119 may cover edges of the pixel electrodes 1510, 1520, and 1530, and increase a distance between a counter electrode 230 thereabove and the pixel electrodes 1510, 1520, and 1530, thereby reducing or preventing the likelihood of the generation of an arc and the like.

The emission layer 221 may include an organic material containing a fluorescent or phosphorescent material for emitting red, green, blue, or white light. The emission layer 221 may include a low molecular weight organic material or a polymer organic material.

The functional layer 222 may be optionally located above and below the emission layer 221. The functional layer 222 may include a hole transport layer (HTL), a hole injection layer (HIL), an electron transport layer (ETL), an electron injection layer (EIL), and/or the like.

The emission layer 221 may have a shape that is patterned corresponding to the pixel electrodes 1510, 1520, and 1530. The functional layer 222 may be variously modified, for example, in one body across the pixel electrodes 1510, 1520, and 1530, to be separately patterned corresponding to each of the pixel electrodes 1510, 1520, and 1530, or the like.

The counter electrode 230 may be a transmissive electrode or a reflective electrode. For example, the counter electrode 230 may be a transparent or semi-transparent electrode, and may include a metal thin film having a low work function including Li, Ca, LiF, Al, Ag, Mg, and a compound thereof. Furthermore, the counter electrode 230 may further include a transparent conductive oxide (TCO) film such as ITO, IZO, ZnO, $In_2O_3$, or the like, which is formed on the metal thin film. The counter electrode 230 may be integrally formed across the front surface of the display area DA, and located above the intermediate layer 220 and the pixel defining layer 119.

An encapsulation layer may be located above the counter electrode 230. In one or more embodiments, the encapsulation layer may have a multilayer structure of at least one inorganic encapsulation layer 310 and at least one organic encapsulation layer 320. The inorganic encapsulation layer 310 and the organic encapsulation layer 320 may prevent or reduce the organic light-emitting device OLED from being exposed to foreign materials such as moisture and the like. In one or more other embodiments, the encapsulation layer may have a structure in which, as a transparent sealing member is coupled to the substrate 100, an inner space between the substrate 100 and the sealing member is sealed.

Referring to FIG. 10, as described above, the compensation capacitor Cc may be configured as the node portion 1120P of the semiconductor layer 1100 functions as the first compensation capacitor plate Cc1, and the protruding electrode 1330P of the second conductive layer 1300 functions as the second compensation capacitor plate Cc2. The protruding electrode 1330P may be integrally formed with the first electrode 1330 that overlaps the driving gate electrode 1230, and functions as the second storage capacitor plate Cst2 of the storage capacitor Cst, and may have a constant voltage applied thereto. Accordingly, a change in the luminance of a pixel due to a signal change of the adjacent data line 1413 may be prevented or reduced.

As described above, according to one or more embodiments, display apparatuses capable of preventing or reducing a change in the luminance of a pixel due to adjacent wirings may be implemented. The scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a substrate;
   a semiconductor layer on the substrate, and having a semiconductor pattern;
   a first conductive layer on the semiconductor layer, and comprising:
      a first wiring that extends in a first direction;
      a second wiring at a same layer as, and directly connected to, the first wiring, and protruding from the first wiring in a second direction crossing the first direction; and
      a driving gate electrode;
   a second conductive layer on the first conductive layer, and comprising a first electrode that overlaps the driving gate electrode; and
   an interlayer insulating layer between the first conductive layer and the second conductive layer,
   wherein the semiconductor pattern comprises:
      a first pattern that extends in the first direction and overlaps the second wiring; and
      a second pattern that extends in the second direction and overlaps the first wiring, and
   wherein the first electrode comprises a protruding electrode that overlaps at least part of the first pattern and at least part of the second pattern.

2. The display apparatus of claim 1, wherein the semiconductor layer comprises a first initialization voltage line and a second initialization voltage line that extend in the first direction, and
   wherein the semiconductor pattern is electrically connected to the first initialization voltage line and the second initialization voltage line.

3. The display apparatus of claim 1, further comprising:
   a first compensation transistor having, as a gate electrode, the second wiring that overlaps the first pattern; and
   a second compensation transistor having, as a gate electrode, the first wiring that overlaps the second pattern,
   wherein the first pattern and the second pattern are provided as one body.

4. The display apparatus of claim 3, further comprising a compensation capacitor having the protruding electrode as an upper electrode, and having the at least part of the first pattern and the at least part of the second pattern that overlap the protruding electrode as a lower electrode.

5. The display apparatus of claim 4, further comprising a storage capacitor having the first electrode as an upper electrode, and having the driving gate electrode as a lower electrode,
   wherein a capacitance of the compensation capacitor is about 50% or more of a capacitance of the storage capacitor.

6. The display apparatus of claim 1, wherein the semiconductor pattern and the first electrode respectively comprise a plurality of semiconductor patterns and a plurality of first electrodes extending in the first direction, and
   wherein the second conductive layer further comprises a connection portion that connects adjacent first electrodes.

7. The display apparatus of claim 6, wherein the first electrode and the connection portion are provided as one body.

8. The display apparatus of claim 1, wherein the second conductive layer further comprises a first scan line extending in the first direction and electrically connected to the second wiring.

9. The display apparatus of claim 1, wherein the first conductive layer comprises a second lower scan line and a third lower scan line that extend in the first direction, wherein the second conductive layer comprises a second scan line electrically connected to the second lower scan line, and a third scan line electrically connected to the third lower scan line, wherein the second lower scan line and the second scan line overlap each other, and wherein the third lower scan line and the third scan line overlap each other.

10. The display apparatus of claim 1, further comprising a third conductive layer on the second conductive layer and comprising a data line that extends in the second direction, wherein the protruding electrode overlaps part of the data line.

11. The display apparatus of claim 10, wherein the protruding electrode protrudes from the first electrode in the second direction.

12. The display apparatus of claim 10, wherein the third conductive layer further comprises a driving voltage line that extends in the second direction, and wherein the driving voltage line is electrically connected to the first electrode.

13. The display apparatus of claim 1, wherein the first electrode exposes an exposed part of the driving gate electrode, wherein a first side of the first pattern is connected to the second pattern, and wherein a second side of the first pattern is electrically connected to the exposed part of the driving gate electrode.

14. The display apparatus of claim 1, wherein the semiconductor pattern comprises a plurality of semiconductor patterns extending in the first direction, wherein the display apparatus further comprises a fourth conductive layer on the second conductive layer and comprising a plurality of pixel electrodes, and wherein a first pixel electrode connected to a first semiconductor pattern of the semiconductor patterns comprises a first protruding portion that overlaps a first pattern of the first semiconductor pattern.

15. The display apparatus of claim 14, wherein a second pixel electrode connected to a second semiconductor pattern of the semiconductor patterns overlaps the second semiconductor pattern and a third semiconductor pattern that is adjacent to the second semiconductor pattern, and wherein the second pixel electrode comprises a second protruding portion that overlaps a first pattern of the second semiconductor pattern, and a third protruding portion that overlaps a first pattern of the third semiconductor pattern.

16. The display apparatus of claim 15, wherein the first pixel electrode and the second pixel electrode are alternately arranged in the first direction, and wherein a third pixel electrode connected to the third semiconductor pattern is arranged to alternate with the first pixel electrode or the second pixel electrode in the second direction.

17. A display apparatus comprising:

a substrate;

a semiconductor layer on the substrate, and having a semiconductor pattern comprising a first pattern extending in a first direction and a second pattern extending in a second direction crossing the first direction;

a first conductive layer on the semiconductor layer, and comprising a first wiring that extends in the first direction and that overlaps the second pattern, a second wiring that protrudes from the first wiring in the second direction and that overlaps the first pattern, and a driving gate electrode;

a second conductive layer on the first conductive layer, and comprising a first electrode that overlaps the driving gate electrode and that comprises a protruding electrode that overlaps at least a part of the first pattern and at least part of the second pattern;

a gate-insulating layer between the semiconductor layer and the first conductive layer; and an interlayer insulating layer between the first conductive layer and the second conductive layer, wherein the driving gate electrode and the first electrode overlap each other with the interlayer insulating layer therebetween.

18. The display apparatus of claim 17, further comprising a first scan line that is on the interlayer insulating layer and extends in the first direction, wherein the first electrode and the first scan line comprise a same material.

19. The display apparatus of claim 17, wherein the protruding electrode, the at least part of the first pattern, and the at least part of the second pattern, overlap each other with the gate-insulating layer and the interlayer insulating layer respectively therebetween.

20. The display apparatus of claim 17, further comprising:

a planarization layer on the second conductive layer; and a third conductive layer on the planarization layer and comprising a driving voltage line and a data line that extend in the second direction, wherein the first electrode and the driving voltage line are connected to each other through a contact hole provided in the planarization layer.

* * * * *